US009354529B2

(12) United States Patent
Ehm et al.

(10) Patent No.: US 9,354,529 B2
(45) Date of Patent: May 31, 2016

(54) ARRANGEMENT FOR USE IN A PROJECTION EXPOSURE TOOL FOR MICROLITHOGRAPHY HAVING A REFLECTIVE OPTICAL ELEMENT

(75) Inventors: Dirk Heinrich Ehm, Lauchheim (DE); Maarten van Kampen, Eindhoven (NL); Stefan-Wolfgang Schmidt, Aalen (DE); Vadim Yevgenyevich Banine, SB Deurne (NL); Erik Loopstra, Eindhoven (DE)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 812 days.

(21) Appl. No.: 13/561,502

(22) Filed: Jul. 30, 2012

(65) Prior Publication Data

US 2013/0077064 A1   Mar. 28, 2013

Related U.S. Application Data

(63) Continuation of application No. PCT/EP2011/000385, filed on Jan. 28, 2011.

(60) Provisional application No. 61/282,367, filed on Jan. 29, 2010.

(30) Foreign Application Priority Data

Jan. 29, 2010   (DE) .......................... 10 2010 006 326

(51) Int. Cl.
*G03B 27/52* (2006.01)
*G03B 27/54* (2006.01)
(Continued)

(52) U.S. Cl.
CPC ............... *G03F 7/70891* (2013.01); *G01J 1/58* (2013.01); *G02B 5/0891* (2013.01); *G03F 7/7085* (2013.01); *G03F 7/70316* (2013.01); *G03F 7/70558* (2013.01); *G03F 7/70958* (2013.01)

(58) Field of Classification Search
CPC ..... G01J 1/58; G02B 5/0891; G03F 7/70316; G03F 7/70133; G03F 7/7015; G03F 7/70191; G03F 7/702; G03F 7/70558; G03F 7/7085; G03F 7/70891; G03F 7/70958
USPC ...................... 355/30, 52, 53, 55, 67–71, 77; 250/492.1, 492.2, 492.22, 493.1, 548, 250/458.1, 461.1, 361 C, 483.1, 484.2
See application file for complete search history.

(56) References Cited

U.S. PATENT DOCUMENTS 4,075,493 A * 2/1978 Wickersheim ................ 374/159
4,223,226 A   9/1980 Quick et al.
(Continued)

FOREIGN PATENT DOCUMENTS

EP       1 530 091 A1   5/2005
WO   WO 2010/149436 A1   12/2010

OTHER PUBLICATIONS

Written Opinion of the International Searching Authority dated Jul. 21, 2011 in international patent application PCT/EP2011/000385 on which the claim of priority is based.
(Continued)

*Primary Examiner* — Christina Riddle
(74) *Attorney, Agent, or Firm* — Walter Ottesen, P.A.

(57) ABSTRACT

An arrangement for use in a projection exposure tool (100) for microlithography comprises a reflective optical element (10; 110) and a radiation detector (30; 32; 130). The reflective optical element (10; 110) comprises a carrier element (12) guaranteeing the mechanical strength of the optical element (10; 110) and a reflective coating (18) disposed on the carrier element (12) for reflecting a use radiation (20a). The carrier element (12) is made of a material which upon interaction with the use radiation (20a) emits a secondary radiation (24) the wavelength of which differs from the wavelength of the use radiation (20a), and the radiation detector (30; 32; 130) is configured to detect the secondary radiation (24).

12 Claims, 3 Drawing Sheets

(51) Int. Cl.
  *G03F 7/20* (2006.01)
  *G01J 1/58* (2006.01)
  *G02B 5/08* (2006.01)

(56) References Cited

U.S. PATENT DOCUMENTS

| | | | | |
|---|---|---|---|---|
| 4,396,720 | A * | 8/1983 | Beall et al. | 501/5 |
| 6,123,455 | A * | 9/2000 | Beshears et al. | 374/161 |
| 6,238,830 | B1 | 5/2001 | Rangarajan et al. | |
| 6,359,678 | B1 * | 3/2002 | Ota | 355/53 |
| 2003/0142410 | A1 | 7/2003 | Miyake | |
| 2004/0114123 | A1 | 6/2004 | Mulder et al. | |
| 2005/0173647 | A1 | 8/2005 | Bakker | |
| 2006/0024589 | A1 | 2/2006 | Schwarzl et al. | |
| 2006/0188000 | A1 | 8/2006 | Bird | |
| 2008/0151221 | A1 | 6/2008 | Sogard | |
| 2010/0014060 | A1 | 1/2010 | Lexmond et al. | |
| 2012/0127440 | A1 * | 5/2012 | Major | G01K 11/20 355/30 |
| 2012/0218536 | A1 | 8/2012 | Bleidistel et al. | |

OTHER PUBLICATIONS

International Search Report dated Jul. 21, 2011 of international application PCT/EP 2011/000385 on which this application is based.
Dinger, U. et al, "Fabrication and metrology of diffraction limited soft x-ray optics for the EUV microlithography", Proc.SPIE 5193, Advances in Mirror Technology for X-Ray, EUV Lithography, Laser, and Other Applications, 18, 12 pages, Jan. 13, 2004.
Muehlig, C., "Laserinduzierte Fluoreszenz (LIF) zur Untersuchung der Defektkinetik in hochreinen synthetischen Quarzglaesern", Andor Technology brochure, LOT-Oriel Gruppe Europa, 2 pages and translation into English of Introduction.
Solomon, S., "Sensors Handbook", Second Edition, 2010, The McGraw-Hill Companies, Inc., Figure 6.5.
"ULER Corning Code 7972 Ultra Low Expansion Glass", Corning Incorporated Brochure, 2008, 4 pages.
"ULE TM Ultra Low Expansion Glass", praezisions glas & optik, pp. 1 and 2, Jan. 8, 2010, www.pgo-online.com/intl/katalog/ule.html.
"ZerodurR Zero Expansion Glass Ceramic", Schott North America Inc. Brochure, pp. 1 to 3, Jan. 8, 2010, www.us.schott.com/advanced_optics/english/our_products/zerodur/zerodur.html.
Hrdina, K., "Production and Properties of ULER Glass with Regards to EUV Masks", presented at The International workshop on Extreme Ultraviolet Lithography, Oct. 10-13, 1999, Monterey Marriott Hotel, 17 pages.

* cited by examiner

US 9,354,529 B2

ARRANGEMENT FOR USE IN A PROJECTION EXPOSURE TOOL FOR MICROLITHOGRAPHY HAVING A REFLECTIVE OPTICAL ELEMENT

CROSS REFERENCE TO RELATED APPLICATIONS

This application is a continuation application of international patent application PCT/EP 2011/000385, filed Jan. 28, 2011, designating the United States and claims priority of German patent application no. 10 2010 006 326.6, filed Jan. 29, 2010, and the U.S. provisional application No. 61/282,367 filed Jan. 29, 2010, and the entire contents of all of the above applications are incorporated herein by reference.

FIELD OF THE INVENTION

The present invention relates to an arrangement for use in a projection exposure tool for microlithography comprising a reflective optical element, an optics module, to a projection exposure tool with this type of arrangement, to a method of measuring the intensity on a reflective optical element of a projection exposure tool, and to a method of measuring a temperature on an optical element of a projection exposure tool for microlithography.

BACKGROUND OF THE INVENTION

Projection exposure tools for microlithography are used to produce micro-structured components using a photolithographic method. Here a structure-carrying mask—the so-called reticle—is illuminated with the aid of an illumination system and imaged onto a photosensitive layer with the aid of projection optics. The illumination system comprises a light source which makes available radiation with an appropriate wavelength, and illumination optics comprising different components which serve to make available uniform illumination with a predetermined angular distribution at the location of the structure-carrying mask. The structure-carrying mask illuminated in this way is imaged onto a photosensitive layer with the aid of the projection optics.

Here the minimum structure width that can be imaged with the aid of this type of projection optics is determined, among other things by the wavelength of the imaging radiation used. The smaller the wavelength of the imaging radiation, the smaller the structures that can be imaged with the aid of the projection optics. Nowadays imaging radiation with the wavelength of 193 nm or imaging radiation with a wavelength in the extreme ultraviolet range (EUV) are used. When using imaging light with a wavelength of 193 nm both refractive optical elements and reflective optical elements are used within the projection exposure tool. In contrast, when using imaging light in the EUV wavelength range only reflective optical elements (mirrors) are used. With a projection exposure tool for microlithography it is necessary for irradiation conditions to remain unchanged on the photosensitive layer during the whole operation. Only in this way can microstructured components of uniform quality be produced. Therefore, the irradiation conditions on the structure-carrying mask must also be as invariable as possible.

However, during operation various influences can change the irradiation conditions on the structure-carrying mask and the photosensitive layer. This can e.g. be heating of the reflective optical elements which thereupon slightly change their position or shape. Furthermore, it is possible for the radiation source to change during continuous operation, i.e. for the position of the light source to shift slightly. Furthermore, e.g. contaminations can also lead to the reflectivity of individual or of all of the mirrors changing. All of these influences lead to a change in the irradiation conditions on the structure-carrying mask and on the photosensitive layer. For this reason it is necessary to constantly monitor the irradiation conditions during operation. Here the measuring device provided for the monitoring should be designed such that monitoring is made possible without having to halt operation of the projection exposure tool for this purpose.

In United States patent application publication 2008/0151221 A1 a reflective optical element is proposed for this purpose with which the reflective coating is partially interrupted in order to guide the radiation striking these points onto a measuring device. The disadvantage of this, however, is that the reflective optical element now has regions which are no longer reflective. Furthermore, only the portion of radiation which is not reflected and so does not contribute to the irradiation conditions on the structure-carrying mask and the photosensitive layer, is monitored.

SUMMARY OF THE INVENTION

It is an object of the invention to provide an arrangement with a reflective optical element and a method for measuring the intensity or a temperature on a reflective optical element of a projection exposure tool for microlithography with which the aforementioned problems are resolved, and in particular a change over time in the irradiation conditions on the structure-carrying mask and the photosensitive layer can be minimized. Further, it is an object to make monitoring of the incoming radiation possible without recesses in the reflective coating of the optical element being necessary.

According to the invention the aforementioned object can be achieved by an arrangement for use in a projection exposure tool for microlithography comprising a reflective optical element and a radiation detector. Here the reflective optical element has a carrier element guaranteeing the mechanical strength of the optical element and a reflective coating disposed on the carrier element for reflecting a use radiation. The carrier element is made of a material which upon interaction with the use radiation emits a secondary radiation the wavelength of which differs from the wavelength of the use radiation. The radiation detector is configured to detect the secondary radiation.

In other words, according to the invention the carrier element of the reflective optical element, which can also be called a mirror substrate, is made of a material which when irradiated with a use radiation emits secondary radiation. This type of material can be, for example, a fluorescent material. Materials emitting phosphorescent or scintillation radiation are also conceivable. The effect of emitting secondary radiation is also referred to as luminescence. Furthermore, according to the invention a radiation detector for detecting the secondary radiation is provided and arranged such that it detects the secondary radiation passing out of the carrier element. It is therefore possible e.g. to monitor the intensity of the use radiation striking the reflective coating of the reflective optical element without in so doing having to omit regions in the reflective coating. By monitoring the intensity of the use radiation, changes over time in the irradiation conditions of the reflective coating, which potentially influence the irradiation conditions on the structure-carrying mask and the photosensitive layer can be corrected accordingly.

According to the invention, the carrier element is designed such that it guarantees the mechanical strength of the optical element. In other words, the carrier element is able to guarantee the strength of the optical element. Independently of this further layers can be arranged which optionally also have this type of mechanical strength, but do not substantially increase the mechanical strength of the optical element due to the presence of the carrier element.

As already mentioned above, the carrier element can also be called a mirror substrate, a mirror substrate being meant here in a narrower sense, to the effect that the mirror substrate is only made of the material guaranteeing the mechanical strength of the optical element and not comprising any further layers often, if so required, subsumed under this type of substrate.

The reflective coating is disposed on the carrier element. This does not necessarily mean that the reflective coating is applied directly to the carrier element. In fact, additional layers can also be disposed between the carrier element and the reflective coating. However, the reflective coating can of course also be applied directly to the carrier element. The reflective coating does not totally reflect the use radiation, for example the exposure radiation of a projection exposure tool. In fact, a first part of the use radiation is reflected on the reflective coating, and a second part passes through the reflective coating and penetrates into the carrier element in which it produces secondary radiation.

According to the invention the carrier element is made of the material emitting the secondary radiation upon interaction with the use radiation. According to an embodiment the greater part by volume of the carrier element consists of the material, in particular more than 60%, especially more than 90% of the carrier element by volume consists of the material. According to a further embodiment, the carrier element is produced totally from the material emitting the secondary radiation. In other words, in this case the carrier element is made totally of the material emitting the secondary radiation, i.e. the carrier element consists of the material over its entire volume.

As mentioned above, the wavelength of the secondary radiation differs from the wavelength of the use radiation, in particular the mean wavelength of the secondary radiation is shifted by at least 10% from the mean wavelength of the use radiation. According to an embodiment the shift is at least 100%, in particular the mean wavelength of the secondary radiation is more than ten times larger than the mean wavelength of the use radiation.

The radiation detector can be applied directly to the substrate, in particular to the rear side of the substrate, or also be spaced apart from the latter. In each case the radiation detector is arranged such that the detector can detect the secondary radiation passing out of the carrier element. Embodiments of the radiation detector include measuring diodes, MOS diodes, Schottky diodes, PIN photodiodes, phototransistors, multichannel plates and CCD cameras.

According to one embodiment of the invention the reflective coating is disposed on a front side of the carrier element, and the radiation detector is disposed facing towards a rear side of the carrier element.

In a further embodiment according to the invention the material emitting the secondary radiation comprises a low expansion material having a coefficient of thermal expansion within the range of −200 ppb/° C. to +200 ppb/° C. over the temperature range of 5° C. to 35° C. According to one version the material consists totally of the low expansion material. In particular, the material emitting the secondary radiation comprises silicate glass and/or a glass ceramic. In one embodiment according to the invention the material emitting the secondary radiation has an average thermal longitudinal expansion coefficient in the temperature range of 5° C. to 35° C. of maximum+/−50×10$^{-9}$ K$^{-1}$, i.e. within the range −50 to +50 ppb/° C., in particular of maximum +/−30×10$^{-9}$ K$^{-1}$ or of maximum+/−10×10$^{-9}$ K$^{-1}$. According to one embodiment according to the invention the material emitting the secondary radiation consists of ULE® glass or Zerodur® glass ceramic, as explained in greater detail in the following. Other embodiments of the low expansion material contained in this application can be applied here as well.

In a further embodiment according to the invention the material emitting the secondary radiation is a fluorescent material, preferably a material with which the fluorescence radiation comes within the visible wavelength range. Preferably the material emitting the secondary radiation is transparent in the wavelength range of the fluorescence radiation.

In a further embodiment according to the invention the material of the carrier element comprises a SiO$_2$ matrix which contains intrinsic defects which upon interaction with the use radiation bring about emission of the secondary radiation, in particular in the form of fluorescence radiation. The intrinsic defects are understood as being deviations from the SiO$_2$ structure. Some of these defects, e.g. oxygen defects or oxygen atoms with free valence can show characteristic fluorescences.

In a further embodiment according to the invention the arrangement according to the invention further comprises an evaluation device which is configured to determine the intensity of the radiation irradiated onto the reflective optical element from the intensity of the radiation detected by the radiation detector. The radiation irradiated onto the reflective optical element is referred to above as use radiation. The radiation detected by the radiation detector is referred to as secondary radiation or radiation passing out of the carrier element. For this purpose the evaluation device preferably uses simulation data which specify how large the portion of the use radiation transmitted through the reflective coating is.

In a further embodiment according to the invention the radiation detector is configured to detect light in the visible wavelength range. Preferably, the radiation detector is configured to detect blue light, in particular in the wavelength range between approximately 350 nm and 400 nm.

In a further embodiment according to the invention the reflective coating is configured to reflect radiation in the extreme ultraviolet wavelength range (EUV), in particular radiation with a wavelength smaller than 100 nm, preferably in the wavelength range of between 5 nm and 15 nm. Here the reflective coating preferably has a plurality of individual layers, e.g. fifty double layers of different materials.

In a further embodiment according to the invention the radiation detector is a spatially resolving radiation detector, for example in the form of a CCD camera. With the latter the intensity distribution of the use radiation irradiated onto the optical element can be determined.

In a further embodiment according to the invention the radiation detector is attached to the rear side of the carrier element. This can be indirect or direct, i.e. the radiation detector can be disposed such as to lie directly against the rear side of the carrier element, or be separated from the carrier element by further layers.

Furthermore, according to the invention an arrangement for use in a projection exposure tool for microlithography comprising a reflective optical element and a radiation detector is provided. Here the reflective optical element comprises a carrier element. The carrier element guarantees the mechanical strength of the optical element and comprises a low expansion material having a coefficient of thermal expansion within the range of −200 ppb/° C. to +200 ppb/° C. over the temperature range of 5° C. to 35° C. The radiation detector is configured to detect radiation passing out of the carrier element. Put in different words, the coefficient of thermal expansion, often referred to as "CTE", is within the range starting at $-200\times10^{-9}$ $K^1$ and ending at $+200\times10^{-9}$ $K^{-1}$. According to an embodiment the CTE of the low expansion material is within the range of $-30$ ppb/° C. to $+30$ ppb/° C. ($0\pm30$ ppb/° C.), according to a further embodiment within the range of $-10$ ppb/° C. to $+10$ ppb/° C. ($0\pm10$ ppb/° C.) over the temperature range of 5° C. to 35° C., respectively. Examples of low expansion materials having the above specification are silicate glass, e.g. ULE® glass, and glass ceramic, e.g. Zerodur® glass ceramic.

By means of the use according to the invention of the low expansion material for the carrier element, by irradiating use radiation onto the optical element secondary radiation can be produced which in turn can be detected by the radiation detector. By evaluating the signals thus produced by the radiation detector e.g. the intensity of the irradiated use radiation can be determined.

According to one embodiment of the invention the reflective optical element comprises a reflective coating disposed on a front side of the carrier element and the radiation detector is disposed facing towards a rear side of the carrier element.

According to a further embodiment of the invention low expansion material, in particular silicate glass, comprises a $SiO_2$ matrix which contains intrinsic defects which cause fluorescence radiation to be emitted upon interaction with irradiated use radiation. As already mentioned above, intrinsic defects are understood as being deviations from the $SiO_2$ structure.

In one embodiment according to the invention the low expansion material comprises silicate glass, especially titanium silicate glass, and in particular the low expansion material consists totally of titanium silicate glass. According to a further embodiment the carrier element comprises a glass ceramic.

In a further embodiment according to the invention the glass ceramic comprises a mean coefficient of linear thermal expansion in the temperature range of 5° C. to 35° C. of maximum$+/-50\times10^{-9}$ $K^{-1}$, in particular of maximum $+/-30\times 10^{-9}$ $K^{-1}$ or of maximum $+/-10\times10^{-9}$ $K^{-1}$.

In a further embodiment according to the invention the low expansion material is made of ULE® glass. ULE® glass stands for "Ultra Low Expansion" glass and is a Corning product identified by Corning Code 2972. When irradiated with EUV radiation ULE® glass produces blue fluorescence light. Alternatively, or in addition, the low expansion material can be made of Zerodur® glass ceramic, a product made by the Schott company. The term "ULE® glass" as used in this application refers to the corresponding product sold by Corning under the product name "ULE®" at the date the application was made. The term "Zerodur® glass ceramic" as used in this application refers to the corresponding product sold by Schott under the product name "Zerodur®" at the date the application was made.

Furthermore, according to the invention an arrangement for use in a projection exposure tool for microlithography comprising a reflective optical element and a radiation detector is provided. According to this arrangement the reflective optical element comprises a carrier element guaranteeing the mechanical strength of the optical element and a reflective coating disposed on the carrier element for reflecting a use radiation. The carrier element comprises a material which upon interaction with an activation radiation converts the activation radiation into a secondary radiation differing from the activation radiation, wherein the material is configured such that an efficiency of the radiation conversion is temperature dependent, and the radiation detector being configured to detect the secondary radiation.

In other words, the carrier element comprises a material which displays luminescence when irradiated with an activation radiation, which activation radiation can be photons with a wavelength smaller than 450 nm, e.g. ArF radiation or EUV radiation or electrons, e.g. having an energy of a few hundred eV. Further, the secondary radiation can be induced by longer-wavelength photos of sufficiently high intensities due to a two photon absorption process.

The efficiency of the conversion of the activation radiation into the secondary radiation, also referred to as luminescence efficiency is temperature dependent. According to an embodiment, the temperature gradient of the radiation conversion efficiency is at least 2%/° C., in particular at least 3%/° C., especially at least 5%/° C.

The above arrangement allows the temperature distribution in the reflective optical element to be monitored. Especially a change over time in the temperature distribution can be detected. This information can be used to take measures correcting the temperature distribution, e.g. be localized heating. This way deviations in the imaging characteristics of the reflective optical element can be minimized.

According to an embodiment, material emitting the secondary radiation comprises a low expansion material as specified in this application, in particular silicate glass. According to a variation, the low expansion material is doped in order to enhance the temperature dependence of the radiation conversion efficiency.

According to a further embodiment, the arrangement further comprises an evaluation unit configured to determine a temperature at the optical element from an intensity of the detected secondary radiation. The evaluation unit may for this purpose be provided with the intensity of the irradiated activation radiation.

According to a further embodiment, the arrangement further comprises an activation source for generating a beam of the activation radiation, which activation source is configured to scan the activation beam over the optical element, wherein the evaluation unit is further configured to correlate the detected secondary radiation with the respective scan position of the activation beam, such that the temperature at the optical element is determined spatially resolved.

According to a further embodiment, the activation radiation comprises the use radiation, and the secondary radiation differs from the activation radiation in wavelength. According to a further embodiment, the activation radiation comprises electron radiation. According to one variation, the electron radiation is irradiated in form of a scanning e-beam with an energy of several 100 eV. The electrons can be irradiated from the front or the back side of the optical element with respect to reflective coating. If the electrons are irradiated from the front, the radiation source should be arranged such that the exposure radiation is not blocked.

The features described with regard to the embodiments mentioned above of the arrangement according to the invention can correspondingly be applied to the arrangement with the carrier element comprising the low expansion material and the arrangement comprising the material having a temperature dependent radiation conversion efficiency and vice versa.

Furthermore, according to the invention an optics module for use in a projection exposure tool for microlithography is provided which comprises at least one arrangement according to the invention according to any of the embodiments described above. The optics module according to the invention can be configured, for example, as illumination optics for illuminating an object field of the projection exposure tool or as projection optics for imaging structures from the object field into an image field.

In one embodiment according to the invention the optics comprise a correction unit configured to influence an exposure radiation used in the projection exposure tool upon the basis of the intensity measured by the radiation detector. Preferably, the correction unit influences here at least one of the following properties of the exposure radiation: energy distribution, angular distribution, polarisation distribution, phase distribution, wave front aberration. According to one version according to the invention the optics comprise a control device which produces a control signal for controlling the correction unit from the intensity detected by the radiation detector.

For illumination optics it is advantageous if the reflective optical element is disposed close to a pupil plane of the illumination optics and the arrangement comprises an evaluation device which is configured to determine a spatially resolved intensity distribution of the exposure radiation irradiated onto the reflective optical element, and by means of the correction unit an intensity distribution in the same or a different pupil plane can be changed. According to a further embodiment the optical element is disposed close to a field plane of the illumination optics, and by means of the correction unit an intensity distribution in this or a different field plane can be changed.

Furthermore, according to the invention a projection exposure tool for microlithography is provided which comprises at least one arrangement according to the invention according to one of the embodiments described above.

Furthermore, according to the invention a method of measuring an intensity on a reflective element of a projection exposure tool for microlithography is provided. Here the optical element comprises a carrier element guaranteeing the mechanical strength of the optical element. Furthermore, a reflective coating is disposed on the carrier element for reflecting exposure radiation of the projection exposure tool. The carrier element comprises a low expansion material having a coefficient of thermal expansion within the range of −200 ppb/° C. to +200 ppb/° C. over the temperature range of 5° C. to 35° C., e.g. silicate glass. With the method according to the invention, during operation of the projection exposure tool a first part of the exposure radiation is reflected on the reflective coating, a second part of the exposure radiation passes through the reflective coating and in the low expansion material generates secondary radiation with a wavelength different from the wavelength of the exposure radiation. Furthermore, the intensity of at least part of the secondary radiation passing out of the carrier element is measured.

The details given above with regard to the arrangement according to the invention of the reflective optical element and the radiation detector can also be applied in the same way to the method according to the invention.

According to one embodiment of the method according to the invention the intensity of the exposure radiation radiated onto the reflective optical element is determined from the measured intensity of the secondary radiation. According to another embodiment, the intensity of the second part of the exposure radiation passing through the reflective coating is determined from the measured intensity of the secondary radiation.

According to one embodiment according to the invention the carrier element is produced totally from a single material. In particular, the reflective coating can furthermore be disposed on a front side of the carrier element, and according to the invention the intensity of the secondary radiation passing out on a rear side of the carrier element is measured.

In one embodiment according to the invention the intensity of at least one part of the secondary radiation passing out of the carrier element, in particular of the secondary radiation passing out on the rear side of the carrier element, is measured, spatially resolved, and from this a spatially resolved intensity distribution of the exposure radiation irradiated onto the reflective optical element is determined.

In a further embodiment according to the invention the intensity of the secondary radiation is measured by means of a radiation detector, and the arrangement of the reflective optical element and the radiation detector is configured according to any of the embodiments described above.

Further, according to the invention a method of measuring a temperature on an optical element of a projection exposure tool for microlithography is provided. The optical element comprises a material configured for converting impinging activation radiation into a secondary radiation differing from the activation radiation. The method comprises: irradiating activation radiation onto the optical element, measuring the intensity of secondary radiation passing out of the optical element, and determining a temperature at the optical element from the measured intensity.

According to an embodiment, the optical element is a reflective optical element in form of a mirror. In this embodiment the optical element comprises a carrier element guaranteeing the mechanical strength of the optical element and a reflective coating disposed on the carrier element for reflecting the exposure radiation of the projection exposure tool. The radiation converting material is contained in the carrier element, in particular the carrier element is made from the converting material.

According to an embodiment, the activation radiation comprises exposure radiation of the projection exposure tool and the secondary radiation differs from the activation radiation in wavelength. According to another embodiment, the activation radiation comprises electron radiation, wherein the secondary radiation is electromagnetic radiation.

According to another embodiment, the intensity of the secondary radiation passing out of the optical element is measured spatially resolved, and from this a spatially resolved temperature distribution of the optical element is determined. The secondary radiation is measured at least one dimensionally, in particular two dimensionally locally resolved.

According to a further embodiment, the intensity of the exposure radiation irradiated onto the optical element is used for determining the temperature at the optical element. According to a variation, the intensity distribution of the exposure radiation is measured beforehand or determined by simulation and used for calculating the temperature distribution of the optical element from a known temperature dependence of the conversion efficiency.

The features specified with regard to the embodiments mentioned above of the methods according to the invention can correspondingly be applied to the arrangements according to the invention. Conversely, the features specified with regard to the embodiments mentioned above of the arrangements according to the invention can also be applied correspondingly to the methods according to the invention.

BRIEF DESCRIPTION OF THE DRAWINGS

The invention will now be described with reference to the drawings wherein.

DESCRIPTION OF THE PREFERRED EMBODIMENTS OF THE INVENTION

In the exemplary embodiments described below elements which are similar to one another functionally or structurally are provided as far as possible with the same or similar reference numbers. Therefore, in order to understand the features of the individual elements of a specific exemplary embodiment, reference should be made to the description of other exemplary embodiments or to the general description of the invention.

Figure 1:
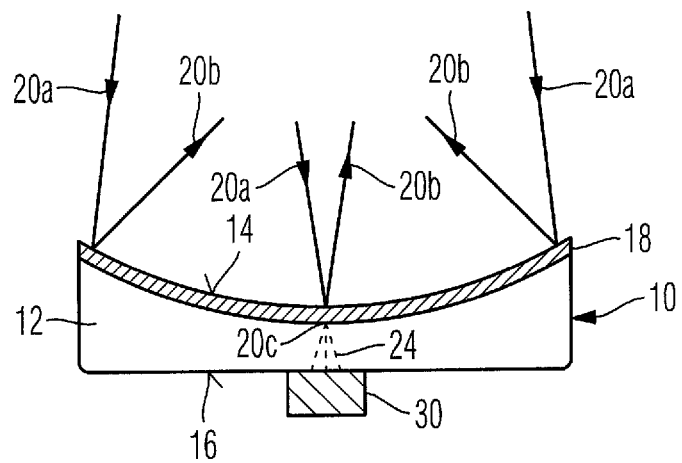
FIG. 1 is a first exemplary embodiment of an arrangement according to the invention comprising a reflective optical element and a radiation detector.

FIG. 1 shows an exemplary embodiment of an arrangement according to the invention of a reflective optical element 10 and a radiation detector 30. The reflective optical element 10 is designed in the form of a concave mirror for use in a projection exposure tool for microlithography. For this purpose the reflective optical element 10 comprises a carrier element 12 having the form of the mirror surface. The carrier element 12 guarantees the mechanical strength of the optical element 10, and at the same time guarantees the function of the latter. The carrier element 12 can also be called a mirror substrate. The carrier element 12 comprises a front side 14 defining the mirror surface and a rear side 16 opposite the latter.

A reflective coating for reflecting an incoming use radiation 20a is applied to the front side 14. In the present exemplary embodiment the reflective coating 18 is configured to reflect use radiation in the form of exposure radiation of an EUV projection exposure tool. Therefore, the reflective coating 18 is designed to reflect radiation in the extreme ultraviolet wavelength range (EUV wavelength range) with a wavelength of <100 nm, preferably a wavelength in the range of 5 nm to 15 nm. For this purpose the reflective coating 18 is in the form of a multi-layer arrangement with, for example, fifty double layers alternately of silicon and molybdenum or lanthanum and $B_4C$.

The incoming use radiation 20a is predominantly reflected by the reflective coating 18 as reflected use radiation 20b. However, a small part of the incoming use radiation 20a passes through the reflective coating 18 and enters into the carrier element 12 as transmitted use radiation 20c. The transmitted use radiation 20c is shown by way of example in FIG. 1 only for the beam of incoming use radiation 20a drawn in the central region of the optical element 10.

Depending on the embodiment, further layers can be disposed between the carrier element 12 and the reflective coating 18. In the present exemplary embodiment the carrier element 12 is made of ULE® glass, a product made by the Corning company identified by Corning code 2972. ULE® glass is made of titanium silicate glass and has a very low coefficient of thermal expansion (CTE) also referred to as linear expansion coefficient, of $0\pm30\times10^{-9}$ $K^{-1}$ ($0\pm30$ ppm/° C.) over the temperature range of 5° C. to 35° C. Alternatively, the carrier element 12 can be produced from Zerodur®, a product made by the Schott company. Zerodur® is a glass ceramic, and has a CTE in the range of $\pm0.005$ to $\pm0.1\times10^6$ $K^{-1}$ ($0\pm5$ ppm/° C. to $0\pm100$ ppm/° C.) over the temperature range of 0° C. to 50° C. The transmitted use radiation 20c is absorbed in the ULE® glass of the carrier element 12, by means of which secondary radiation 24 is produced in the form of fluorescence light in the blue wavelength spectrum between approximately 350 and 400 nm. This secondary radiation 24, also referred to as luminescence, passes out on the rear side 16 of the carrier element. According to the invention a radiation detector 30 is arranged such that it faces towards the rear side 16 of the carrier element 12. According to one exemplary embodiment the radiation detector 30 is disposed directly on the rear side 16 of the carrier element 12. In other exemplary embodiments further layers can be disposed between the rear side 16 and the radiation detector 30. Furthermore, the radiation detector 30 can also be disposed a distance away from the carrier element 12, and only be aligned to the rear side 16 such that the detector 30 can detect the secondary radiation 24.

Figure 2:
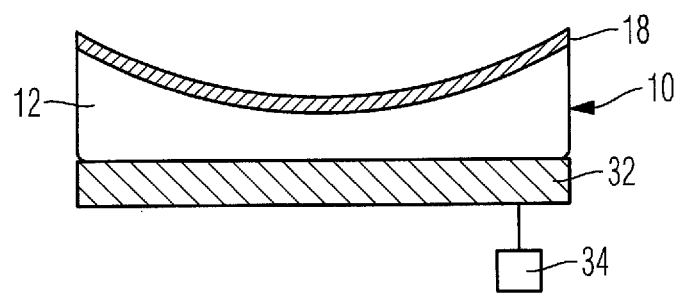
FIG. 2 is the reflective optical element according to FIG. 1 comprising a radiation detector in a further embodiment and an evaluation device.

Whereas the radiation detector 30 in the arrangement according to FIG. 1 measures the total intensity of the secondary radiation 24 striking the detector surface of the latter, according to FIG. 2 the reflective optical element 10 is provided with a spatially resolving radiation detector 32. Therefore, by means of the arrangement according to FIG. 2 the intensity of the use radiation 20a arriving at the reflective coating 18 can be determined two-dimensionally, spatially resolved.

In order to determine the intensity of the incoming use radiation 20a from the detected intensity of the secondary radiation 24 the radiation detector 32 can optionally be provided with an evaluation device 34. The evaluation device 34 is only shown in FIG. 2, but can also be used in other arrangements shown in the figures. The evaluation by means of the evaluation device 34 is based upon simulation results from which the portion of transmitted use radiation 20c in the incoming use radiation 20a emerges. Here the reflectivity of the coating 18 as well as the absorption losses of the use radiation in the reflective coating 18 and the surface of the carrier element 12 are taken into account.

Figure 3:
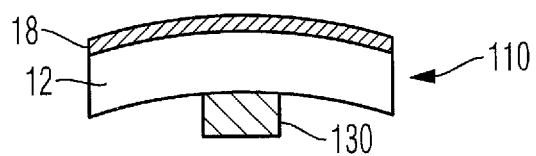
FIG. 3 is a further exemplary embodiment of an arrangement according to the invention comprising a reflective optical element and a radiation detector.

FIG. 3 shows a further exemplary embodiment according to the invention of an arrangement comprising a reflective optical element 110 and a radiation detector 130. This arrangement is used in the projection exposure tool 100 for microlithography described with reference to FIG. 4. The reflective optical element 110 only differs from the element 10 according to FIGS. 1 and 2 in that the optical surface of the element 110 is convex. In the same way as the radiation detector 30, the radiation detector 130 is designed as a detector measuring the total intensity of the incoming secondary radiation 24.

As already mentioned above, FIG. 4 shows an overview of the structure of a projection exposure tool 100 for microlithography in which the reflective optical element 110 is used together with the radiation detector 130. The projection exposure tool 100 may further contain an additional reflective optical element 210 together with a radiation detector 230 explained in more detail below with reference to FIG. 7. The components shown in FIG. 4 comprise a light source 135, illumination optics 137 and projection optics 139. Here the light source 135 produces exposure radiation 120 in the extreme ultraviolet, i.e. with a wavelength smaller than 100 nm, preferably in the range between 5 nm and 15 nm. This radiation is then guided into the illumination optics 137 which prepare the radiation appropriately so as to thus illuminate a structure-carrying mask at the location of an object field 141. The object field 141 is then imaged with the aid of the projection optics 139 onto a photosensitive layer in an image plane 143 of the projection exposure tool 100.

Figure 4:
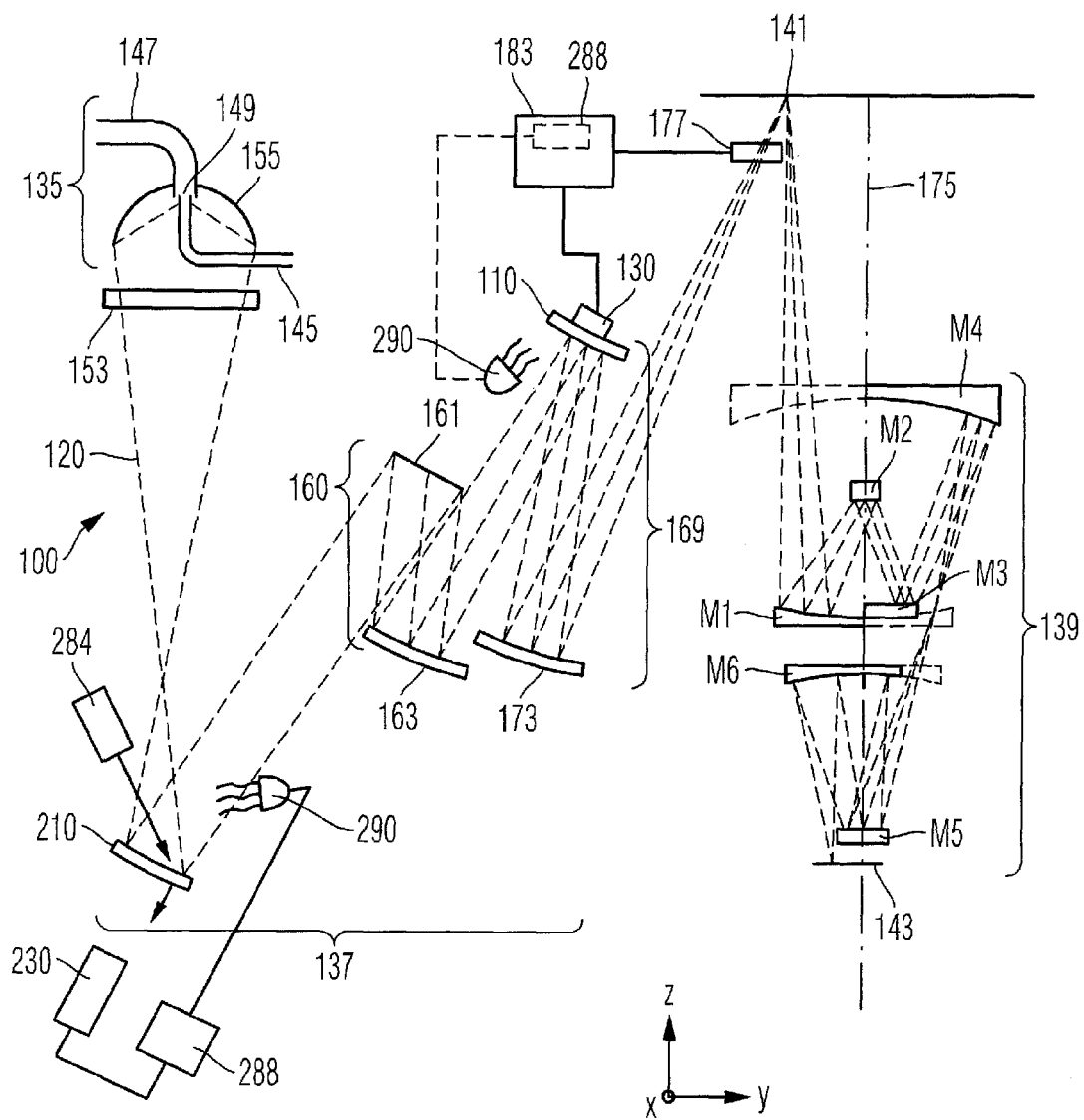
FIG. 4 is a projection exposure tool for microlithography with which the arrangement according to the invention of an optical element and radiation detector is used for measuring an intensity irradiated onto the optical element or for measuring a temperature distribution of the optical element during operation of the projection exposure tool.
Figure 5:
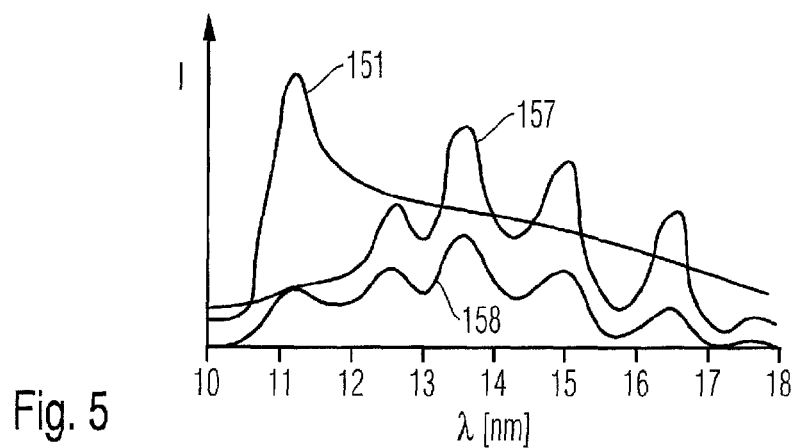
FIG. 5 is a diagram showing the spectral distribution of the radiation striking the reflective optical element in the projection exposure tool according to FIG. 4.

In the following the components of the light source 135, the illumination optics 137 and the projection optics 139 will be described in detail. In the present case the light source 135 is a xenon light source. With the aid of a gas supply 145 and a gas extraction system 147 a gas target is produced at the location 149. The xenon gas at the location 149 is converted by means of an electrode discharge into a plasma state. The plasma now emits radiation in the EUV wavelength range with the input spectrum 151 shown in FIG. 5. The radiation produced is collected with the aid of an ellipsoidal mirror 155, and then passes through a spectral filter 153 the transmission spectrum 157 of which is also shown in FIG. 5. In FIG. 4 the spectral filter 153 is shown disposed directly after the light source 135. However, this arrangement is only one possibility for positioning the spectral filter 153. In principle, the latter can be positioned anywhere in the optical path of the beam in front of the image plane 143. As shown in FIG. 4, the spectral filter 153 can be in the form of a transmission filter. Alternatively, a design as a reflection filter, for example, can also be considered. The exposure radiation 120 leaving the spectral filter 153 has the intensity distribution identified by reference number 158 with an intensity maximum at approximately 13.5 nm.

The exposure radiation 120 is delivered to a first mirror of the illumination optics 137. In the shown embodiment the first mirror is formed by the reflective optical element 210 also illustrated in FIG. 7. As the next component in the optical path the illumination optics 137 contain a honeycomb condenser 160 which comprises a first bevelled mirror 161 and a second bevelled mirror 163. A condenser 169 is disposed in the optical path after the honeycomb condenser 160. This condenser 169 comprises a first condenser mirror in the form of the reflective optical element 110 according to FIG. 3 and a second condenser mirror 173. The object field 141 is imaged with the aid of the projection optics 139 into the image plane 143 in which a photosensitive layer can be disposed. The projection optics 139 have an optical axis 175 and comprise the mirrors M1, M2, M3, M4, M5 and M6. All of these mirrors have a surface shape which follows a section from an area that is rotationally symmetrical in relation to the optical axis 175. For this reason the region in which the best imaging quality is achieved—the object field 141—is also rotationally symmetrical in relation to the optical axis 175.

During operation of the projection exposure tool 100 a structure-carrying mask is disposed at the location of the object field 141. This mask is illuminated with the aid of the light source 135 and the illumination optics 137 and then imaged, reduced in size, by means of the projection optics 139 into the image plane 143. In the image plane 143 a photosensitive layer is then disposed on a substrate in the form of a wafer. By means of the exposure the photosensitive layer is changed chemically so that with the aid of a lithographic chemical process a microelectronic component can be produced from the latter.

Often the projection exposure tool 100 is operated as a so-called step and scan tool, also called a scanner in short. Here the structure-carrying mask which is to be imaged is larger than the object field suitable for the imaging. For this reason the mask is moved through the static object field 141 in the Y direction. At the same time the substrate with the photosensitive layer is moved in the image plane, also in the Y direction, at a correspondingly lower speed. Therefore, every point of the structure-carrying mask moves in the Y direction through the illuminated object field 141 and is thus exposed to a quantity of light—the so-called dose—which corresponds to the integral over the irradiation strength along the trajectory of the point. For the lithographic process it is advantageous if every point on the mask is exposed to the same dose as far as possible. For this purpose a correction unit 177 is provided close to the object field 141.

The correction unit 177 can comprise, for example, a plurality of apertures which restrict the illumination of the object field 141. If during the scanning process a point of the structure-carrying mask now passes through the illuminated object field 141, after a certain time it passes into the shadow caused by this type of aperture. Therefore, the integrated irradiation strength, i.e. the dose, is dependent upon at which position the corresponding aperture is located. Therefore, by changing the position of the apertures the dose can be set in the object field 141. The correction unit 177 comprises a plurality of apertures offset in the X direction. Therefore, the dose can be set separately for different X positions of the object field 141. During operation of the projection exposure tool 100 a constant uniform dose must be guaranteed on a sustained basis over the object field 141 in the X direction. Since, however, during operation certain properties of the projection exposure tool 100 can change, it is necessary to adjust the correction unit 177. It can come about therefore, e.g. that the reflective coating of the optical elements of the illumination optics 137 or the light source 135 become contaminated over time or change in some other way due to the effect of the radiation. These effects lead to the reflectivity of the reflective coatings changing. Therefore however, the intensity distribution of the radiation in the object field 141 also changes, and this leads to the correction unit 177 having to be readjusted.

So that these changes can already be monitored during operation of the projection exposure tool 100, according to the invention at least one of the mirrors of the illumination optics 137 or the projection optics 139 is produced in the form of the optical element 10 or 110 described above and provided with the radiation detector 30, 32 or 130. In this way one can at any time control whether the irradiation strength or the position of the illumination on one of the optical elements changes during operation. It is particularly advantageous if at least one of the mirrors disposed close to a field plane of the illumination optics 137 is in the form of this type of reflective optical element according to the invention and is provided with the radiation detector according to the invention. As already mentioned above, in the exemplary embodiment of FIG. 4 this is the first mirror of the condenser 169 which is formed by the reflective optical element 110 of FIG. 3.

An advantage of the arrangement of the reflective optical element 110 according to the invention together with the radiation detector 130 close to a field plane of the illumination optics 137 is that the intensity distribution of the illumination on the reflective optical element 110 is in a simple way associated with the intensity distribution of the illumination of the object field 141. Therefore, the setting of the correction unit 177 can be adapted upon the basis of the result of the illumination measurement on the reflective optical element 110. For this purpose a control unit 183 is provided which receives the signals of the radiation detector 130 of the reflective optical element 110, and from this generates a control signal with which actuators which change the position of the apertures of the correction unit 177 in the Y direction are controlled. In this way it is guaranteed that during operation an even dose is provided over the object field 141 in the X direction without in the meantime having to shut down the tool for control measurements.

Furthermore, a further reflective optical element of the projection exposure tool 100 can be formed according to the invention and be provided with a spatially resolving radiation detector 32 and a corresponding correction unit.

Figure 6:
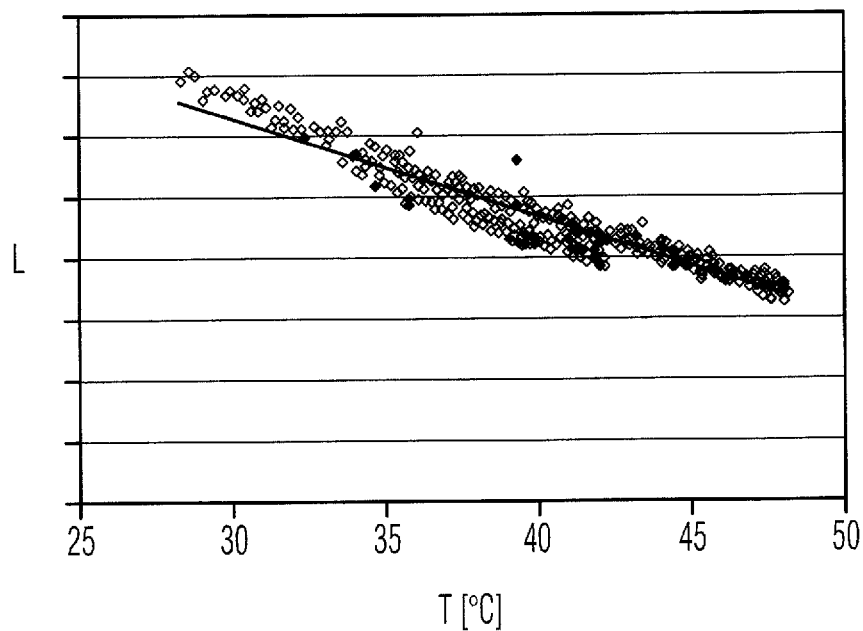
FIG. 6 is a diagram illustrating a temperature dependence of an exemplary material used for a substrate of the optical element according to FIGS. 1 to 3; and, FIG. 7 is a further exemplary embodiment of an arrangement according to the invention comprising a reflective optical element and a radiation detector configured for measuring a temperature distribution of the optical element during operation in the projection exposure tool according to FIG. 4.

In addition to controlling the dose in the object field, the inventive arrangement of the reflective optical element 110 and the radiation detector 130 can be further used to monitor a temperature distribution in the optical element 110 during operation of the projection exposure tool 100. For this purpose, a temperature dependence in the luminescence efficiency of the material used for the carrier element 12 is utilized. As mentioned above, the carrier element 12 can be made e.g. from ULE® glass or Zerodur®. FIG. 6 depicts a chart showing measured peak luminescence L, i.e. the peak intensity of the secondary radiation 24, for a ULE® substrate at different substrate temperatures T. Hereby the intensity of the incoming radiation is kept constant. The chart shows a temperature gradient of the luminescent efficiency, also referred to as radiation conversion efficiency, of about 3%/° C. The gradient for the luminescent efficiency may be improved by e.g. doping the substrate material.

The temperature dependence is ascribed to a thermally induced escape of trapped electrons. Trapped electrons that would normally show radiative de-excitation can escape from their trap and thus reduce the luminescent efficiency. For shallow traps the temperature dependence of this leakage range is higher, allowing for a steeper temperature dependence of the response.

As already mentioned above, in the projection exposure tool shown in FIG. 4, the temperature monitoring according to the invention is illustrated by example of the reflective optical element 110 and the reflective optical element 210. In the case of the optical element 110 the exposure radiation 120 of the projection exposure tool 100 is used as activation radiation for triggering the generation of secondary radiation 24. The intensity of the secondary radiation 24 is measured by the radiation detector 130. Advantageously, the radiation detector 130 is configured as a spatially resolving detector, shown in FIG. 2 under reference numeral 32. In this case the spatial distribution of the secondary radiation 24 is measured in two dimensions over the areal extension of the optical element 110 by the spatially resolving radiation detector. The resulting intensity measurement is forwarded to an evaluation unit 288.

The evaluation unit 288 is further provided with the intensity distribution of the exposure radiation 120 impinging on the optical element 110. This intensity distribution can be obtained by simulation or from an intensity measurement according to the invention, as described above, using the luminescent property of the optical element 110. Typically, the intensity distribution of the exposure radiation 120 remains more stable than the temperature distribution of the optical element 110. In other words, the variability of the temperature distribution is typically larger than the variability of the exposure radiation distribution. Therefore, an intensity distribution measured beforehand may be used for calculating the temperature distribution.

The evaluation unit 288 uses a known relationship between temperature and luminescence of the substrate in form of the carrier element 12, an example of which is shown in FIG. 6, to calculate the temperature distribution of the optical element 110 from the intensity distribution measured by the radiation detector 130. The temperature distribution should remain essentially flat to minimize imaging errors. In case a non-uniformity in the temperature distribution is detected during operation of the projection exposure tool 100, the evaluation unit 288 activates a heating device 290 configured for localized heating of the optical element 110.

The heating device 290 can e.g. be configured as a radiation source irradiating heat onto the optical element 110. Hereby the heat radiation is locally varied, such that the temperature distribution of the optical element 110 is balanced out accordingly. The heating device can also be provided in other suitable configurations, e.g. in configurations, which can be integrated into the optical element 110 etc. Further, the temperature distribution may be balanced by cooling the optical element 110 in an appropriate way.

Figure 7:
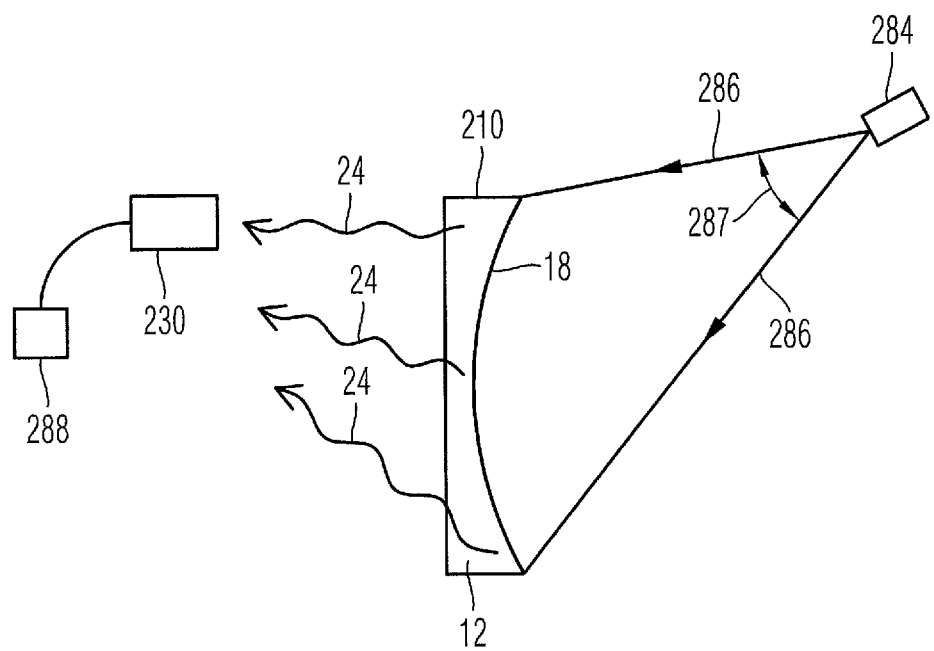

As mentioned above, FIG. 4 also illustrates with respect to the optical element 210 a further embodiment for controlling the temperature distribution. This embodiment is also illustrated in FIG. 7. Here a beam 286 of electrons is used as activation radiation instead of the exposure radiation 120 of the exposure tool 100. For this purpose a scanning e-beam source is positioned as activation source 284 outside the beam path of the exposure radiation 120. In further embodiments the activation source 284 can also be configured as a radiation source emitting electromagnetic radiation of suitable wavelength.

In the illustrated case, the activation source 284 is positioned in front of the optical element 210, i.e. facing the reflective coating 18 of the optical element 210. Alternatively, the activation source 284 may also be positioned to the back of the optical element 210, i.e. facing the back side of the carrier element 12. For performing a temperature measurement, the beam 286 of electrons is scanned over the surface of the reflective coating 18, as illustrated by a double arrow 287. A certain distance behind the optical element 210 a radiation detector 230 is positioned for measuring the intensity of the secondary radiation generated in the carrier element 12. The intensity is recorded time resolved and correlated by an evaluation unit 288 with the respective position of the beam 286, irradiating the front of the optical element 210. Hereby, each position on the front of the optical element 210 is associated with a respective intensity measurement.

The evaluation unit 288 calculates the temperature distribution over the optical element 210 analogously to the procedure described. The procedure according to FIG. 7, however does not require knowledge of the intensity distribution of the exposure radiation 120 of the exposure tool 100. Instead the intensity of the electron beam 286 is used for calculating the temperature distribution from the measured intensity distribution of the secondary radiation 24.

Further, a heating device 290, as described above, is provided for compensating measured non-uniformities in the temperature distribution of the optical element 210.

It is understood that the foregoing description is that of the preferred embodiments of the invention and that various changes and modifications may be made thereto without departing from the spirit and scope of the invention as defined in the appended claims.

LIST OF REFERENCE NUMBERS 10 reflective optical element
12 carrier element
14 front side
16 rear side
18 reflective coating
20a incoming use radiation
20b reflected use radiation
20c transmitted use radiation
24 secondary radiation
30 radiation detector
32 spatially resolving radiation detector
34 evaluation device
100 projection exposure tool for microlithography
110 reflective optical element
120 exposure radiation
130 radiation detector
135 light source
137 illumination optics
139 projection optics
141 object field
143 image plane
145 gas supply
147 gas extraction system
149 location
151 input spectrum
155 ellipsoidal mirror
153 spectral filter
157 filter spectrum
158 spectral distribution of the exposure radiation
160 honeycomb condenser
161 first bevelled mirror
163 second bevelled mirror
169 condenser
M1, M2, M3, M4, M5, M6 mirrors of the projection optics
173 mirror of the condenser
175 optical axis
177 correction unit
183 control unit
210 reflective optical element
230 radiation detector
284 activation source
286 beam of electrons
287 double arrow
288 evaluation unit
290 heating device

What is claimed is:

1. An arrangement for use in a projection exposure tool for microlithography, the arrangement comprising:
    a reflective optical element including a carrier for imparting mechanical strength to said optical element;
    said reflective optical element further including a reflective coating disposed on said carrier for reflecting use radiation having a first wavelength;
    more than 50% by volume of said carrier comprising a material which, upon interaction with said use radiation, emits a secondary radiation having a second wavelength different from said first wavelength; and,
    a radiation detector configured to detect said secondary radiation.

2. The arrangement according to claim 1, further comprising an evaluation device configured to determine the intensity of radiation irradiated onto said reflective optical element from the intensity of the radiation detected by said radiation detector.

3. The arrangement according to claim 1, wherein the material emitting the secondary radiation comprises a silicate glass and/or a glass ceramic.

4. The arrangement according to claim 1, wherein the reflective optical element has the reflective coating disposed on a front side of the carrier element and the radiation detector faces towards a rear side of the carrier element.

5. The arrangement according to claim 1, wherein the radiation detector is configured to detect light in the visible wavelength range.

6. The arrangement according to claim 1, wherein the reflective optical element comprises the reflective coating which is configured to reflect radiation in the extreme ultraviolet wavelength range.

7. The arrangement according to claim 1, wherein the radiation detector is attached to the rear side of the carrier element.

8. The arrangement according to claim 1, wherein
    said material is configured to cause an efficiency of the radiation conversion to be temperature dependent.

9. The arrangement according to claim 8, wherein the temperature gradient of the radiation conversion efficiency is at least 2% /° C.

10. The arrangement according to claim 8, further comprising an evaluation unit configured to determine a temperature at the optical element from an intensity of the detected secondary radiation.

11. The arrangement according to claim 10, further comprising an activation source for generating a beam of an activation radiation, which upon interaction with said material is converted into said secondary radiation; said activation source being configured to scan the activation beam over the optical element; and, said evaluation unit being further configured to correlate the detected secondary radiation with the respective scan position of the activation beam, such that the temperature at the optical element is determined spatially resolved.

12. The arrangement according to claim 11, wherein the activation radiation comprises the use radiation and the secondary radiation differs from the activation radiation in wavelength.

* * * * *